United States Patent
Takahama et al.

(10) Patent No.: US 8,927,853 B2
(45) Date of Patent: Jan. 6, 2015

(54) SOLAR CELL

(75) Inventors: Tsuyoshi Takahama, Neyagawa (JP); Masayoshi Ono, Sumoto (JP); Hiroyuki Mori, Kaizuka (JP); Youhei Murakami, Izumisano (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 158 days.

(21) Appl. No.: 13/203,513

(22) PCT Filed: Feb. 26, 2010

(86) PCT No.: PCT/JP2010/053086
§ 371 (c)(1),
(2), (4) Date: Nov. 23, 2011

(87) PCT Pub. No.: WO2010/098445
PCT Pub. Date: Sep. 2, 2010

(65) Prior Publication Data
US 2012/0090674 A1    Apr. 19, 2012

(30) Foreign Application Priority Data
Feb. 26, 2009  (JP) .................. 2009-044431

(51) Int. Cl.
H01L 31/00     (2006.01)
H01L 31/0747   (2012.01)
H01L 31/20     (2006.01)
H01L 31/0224   (2006.01)
H01L 31/18     (2006.01)

(52) U.S. Cl.
CPC .......... *H01L 31/0747* (2013.01); *H01L 31/202* (2013.01); *H01L 31/022441* (2013.01); *H01L 31/1804* (2013.01); *Y02E 10/547* (2013.01)
USPC ...................................... 136/255

(58) Field of Classification Search
CPC ................ H01L 31/022441; H01L 31/0747
USPC .................................... 136/255, 256
See application file for complete search history.

(56) References Cited

U.S. PATENT DOCUMENTS

| | | | | |
|---|---|---|---|---|
| 4,396,793 | A * | 8/1983 | Madan .................. | 136/255 |
| 4,642,414 | A * | 2/1987 | Rasch et al. ........... | 136/256 |
| 2005/0062041 | A1 | 3/2005 | Terakawa et al. | |
| 2008/0142075 | A1* | 6/2008 | Reddy et al. .......... | 136/257 |
| 2009/0007960 | A1* | 1/2009 | Ito et al. .............. | 136/255 |
| 2009/0223562 | A1 | 9/2009 | Niira et al. | |
| 2011/0000532 | A1* | 1/2011 | Niira et al. ........... | 136/255 |

FOREIGN PATENT DOCUMENTS

| | | |
|---|---|---|
| CN | 1601759 A | 3/2005 |
| JP | 2005-101151 A | 4/2005 |
| JP | 2005-101240 A | 4/2005 |
| WO | WO2008-050889 A1 | 5/2008 |
| WO | WO2009-096539 A1 | 8/2009 |
| WO | WO 2009096539 A1 * | 8/2009 |

* cited by examiner

*Primary Examiner* — Eli Mekhlin
(74) *Attorney, Agent, or Firm* — Marvin A. Motsenbocker; Mots Law, PLLC (57) ABSTRACT

A solar cell (100) includes a p-type amorphous semiconductor layer (11p), an n-type amorphous semiconductor layer (12n), and a recombination layer (R) interposed between the p-type amorphous semiconductor layer (11p) and the n-type amorphous semiconductor layer (12n).

10 Claims, 7 Drawing Sheets

SECOND
DIRECTION

(12) United States Patent
US 8,927,853 B2

SOLAR CELL

TECHNICAL FIELD

The present invention relates to a back contact solar cell.

BACKGROUND ART

Solar cells can convert sunlight, which is clean and is available in unlimited amounts, directly into electricity. Therefore, solar cells are expected as a new energy source.

Conventionally, a so-called back contact solar cell is proposed which includes a plurality of p-side electrodes and a plurality of n-side electrodes on the back surface of an n-type semiconductor substrate (see Patent Document 1, for example).

Specifically, the solar cell according to Patent Document 1 includes: an i-type semiconductor layer covering the back surface of an n-type semiconductor substrate; a plurality of p-type semiconductor layers formed along a predetermined direction on the i-type semiconductor layer; and an n-type semiconductor layer covering the i-type semiconductor layer and the plurality of p-type semiconductor layers. Each p-side electrode is formed above each p-type semiconductor layer, with the n-type semiconductor layer being interposed therebetween. Each n-side electrode is formed between the two p-side electrodes.

According to such a configuration, it is not necessary to cover the p-type semiconductor layer with a mask during a step of forming the n-type semiconductor layer, and thus, it is possible to simplify a step of manufacturing a solar cell.

PRIOR ART DOCUMENT

Patent Document 1: Japanese Unexamined Patent Application Publication No. 2005-101151 (paragraph [0039] and FIG. 2).

SUMMARY OF THE INVENTION

However, in the configuration described in Patent Document 1, an electric field in an opposite direction of the electric field formed by an n-type semiconductor substrate and a p-type semiconductor layer is formed by an n-type semiconductor layer formed on a p-type semiconductor layer and the p-type semiconductor layer. Thus, it is difficult to improve a solar cell characteristic.

The present invention has been achieved in view of the above-described problem, and an object thereof is to provide a back contact solar cell by which it is possible to improve a solar cell characteristic.

A solar cell according to a feature of the present invention summarized as including: a semiconductor substrate; a first semiconductor layer of first conductivity type formed on a first region on one main surface of the semiconductor substrate; and a second semiconductor layer of second conductivity type formed on a second region on the one main surface of the semiconductor substrate, wherein the second semiconductor layer is formed to extend over the second region and the first semiconductor layer, and on the first region, a recombination layer inserted between the first semiconductor layer and the second semiconductor layer is provided.

According to a solar cell based on a characteristic of the present invention, it is possible to inhibit the formation of a reverse junction of a first semiconductor layer and a second semiconductor layer on the back surface side of a junction formed by a substrate and the first semiconductor layer. Accordingly, it is possible to reduce a carrier collection loss, and therefore, it is possible to improve a solar cell characteristic.

In the solar cell according to the feature of the present invention, the solar cell may include: a first electrode formed on the first semiconductor layer, on the first region; and a second electrode formed on the second semiconductor layer, on the second region, wherein the first electrode may be connected to the first semiconductor layer, with the recombination layer being interposed.

In the solar cell according to the feature of the present invention, the recombination layer may be formed of the same semiconductor as that of the second semiconductor layer, and a dopant amount contained in the recombination layer may be larger than a dopant amount contained in the second semiconductor layer.

In the solar cell according to the feature of the present invention, the recombination layer may be formed of the same semiconductor as that of the first semiconductor layer, and a dopant amount contained in the recombination layer may be larger than a dopant amount contained in the first semiconductor layer.

In the solar cell according to the feature of the present invention, the recombination layer may be formed of microcrystalline silicon.

In the solar cell according to the feature of the present invention, the recombination layer may be formed of a metal.

In the solar cell according to the feature of the present invention, the second conductivity type may be of p-type.

In the solar cell according to the feature of the present invention, the solar cell may include a third semiconductor layer of the second conductivity type may be inserted between the recombination layer and the second semiconductor layer.

According to the present invention, it is possible to provide a back contact solar cell by which it is possible to improve a solar cell characteristic.

MODES FOR CARRYING OUT THE INVENTION

With reference to the drawings, embodiments of the present invention will be described. In the following description of the drawings, the same or similar parts will be denoted by the same or similar reference numerals. However, it should be noted that the drawings are schematic and ratios of respective dimensions and the like are different from actual ones.

Therefore, the specific dimensions, etc., should be determined in consideration of the following explanations. It is needless to say that relations and ratios among the respective dimensions differ among the diagrams.

[First Embodiment]

(Configuration of Solar Cell)

Figure 1:
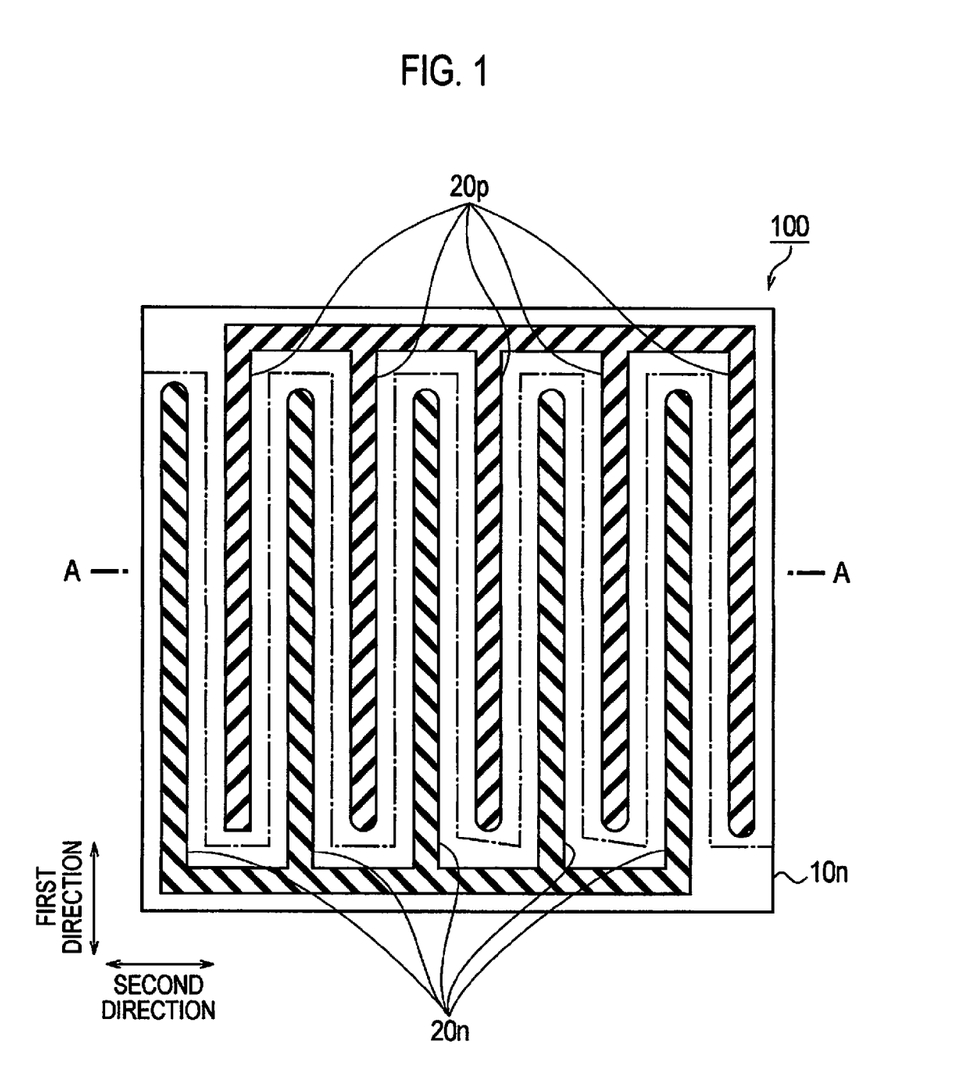
FIG. 1 is a plan view of the back surface side of a solar cell 100 according to a first embodiment of the present invention.
Figure 2:
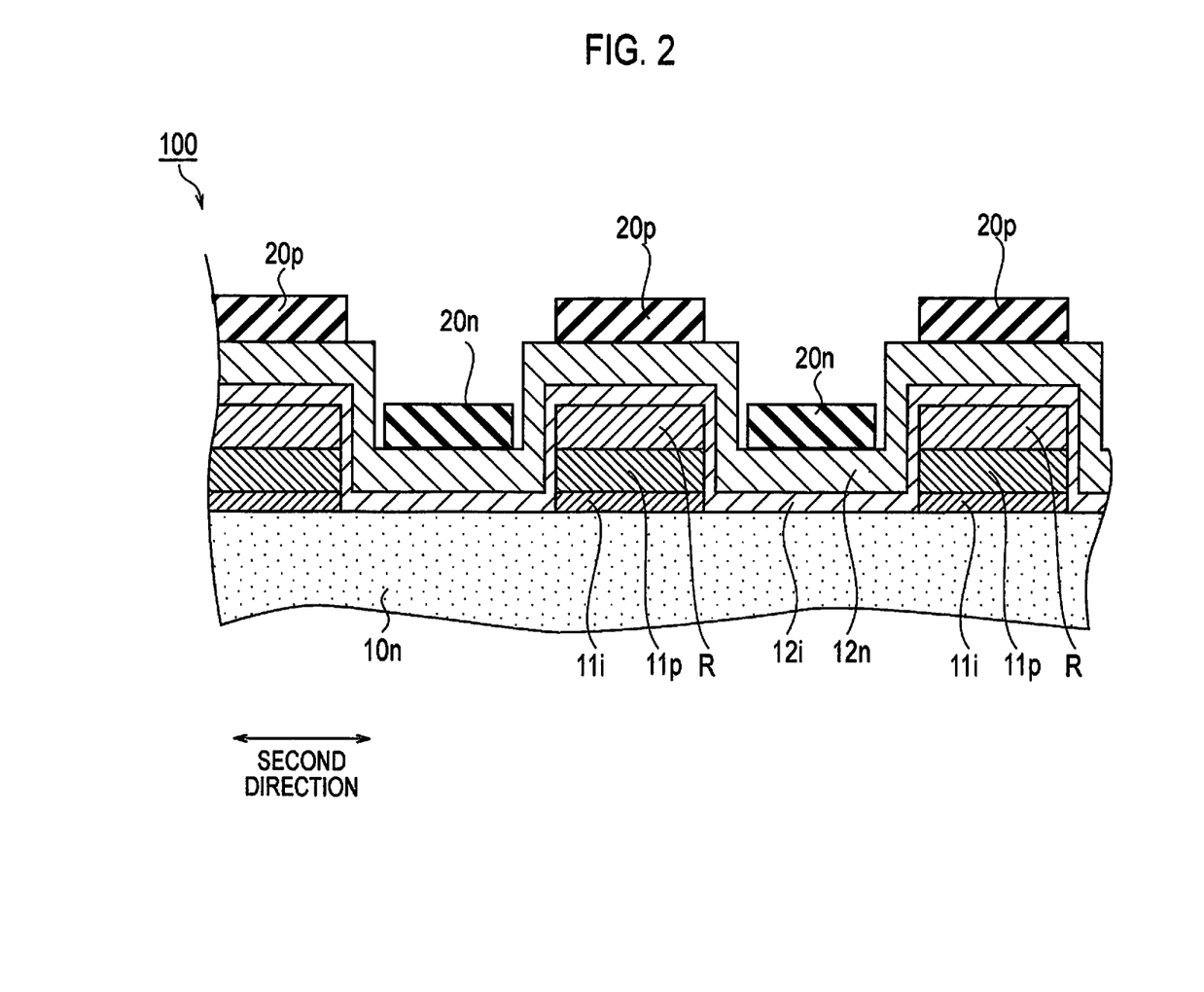
FIG. 2 is an enlarged cross-sectional view taken along the A-A line of FIG. 1.

The configuration of a solar cell 100 according to the first embodiment of the present invention will be explained with reference to FIG. 1 and FIG. 2. FIG. 1 is a plan view of the back surface side of the solar cell 100 according to the first embodiment. FIG. 2 is an enlarged cross-sectional view along the A-A line of FIG. 1.

As illustrated in FIG. 1 and FIG. 2, the solar cell 100 includes an n-type crystalline silicon substrate 10n, an i-type amorphous semiconductor layer 11i, a p-type amorphous semiconductor layer 11p, an i-type amorphous semiconductor layer 12i, an n-type amorphous semiconductor layer 12n, a p-side electrode 20p, an n-side electrode 20n, and a recombination layer R.

The n-type crystalline silicon substrate 10n is formed of a laminated monocrystalline silicon or polycrystalline silicon. The n-type crystalline silicon substrate 10n includes a light receiving surface to receive sunlight and a back surface arranged on an opposite side of the light receiving surface. The n-type crystalline silicon substrate 10n generates a photogenerated carrier by the light received on the light receiving surface. The photogenerated carrier includes an electron and a hole produced when light is absorbed into the n-type crystalline silicon substrate 10n. Although not illustrated, it should be noted that a structure (e.g., an electrode) that prevents light being incident thereon is not formed on the light receiving surface of the n-type crystalline silicon substrate 10n, and light can be received on the entire light receiving surface.

The i-type amorphous semiconductor layer 11i is formed along a first direction on the back surface of the n-type crystalline silicon substrate 10n. The i-type amorphous semiconductor layer 11i is formed without actively introducing an impurity. The thickness of the i-type amorphous semiconductor layer 11i is about several Å to 250 Å, for example, i.e., substantially not as sufficient as to contribute to the electric generation.

The p-type amorphous semiconductor layer 11p is formed along the first direction on the i-type amorphous semiconductor layer 11i. The p-type amorphous semiconductor layer 11p is p-type conductivity type. The thickness of the p-type amorphous semiconductor layer 11p is about 10 nm, for example.

It is noted that although the i-type amorphous semiconductor layer 11i may not be formed, according to a structure in which the i-type amorphous semiconductor layer 11i and the p-type amorphous semiconductor layer 11p are sequentially formed on the n-type crystalline silicon substrate 10n (a so-called "HIT" (trademark, SANYO Electric Co., Ltd.) structure), it is possible to improve a pn junction characteristic.

The i-type amorphous semiconductor layer 12i is formed to extend over the back surface of the n-type crystalline silicon substrate 10n and the p-type amorphous semiconductor layer 11p. In the first embodiment, the i-type amorphous semiconductor layer 12i is formed to cover an almost entire back surface of the n-type crystalline silicon substrate 10n. When the i-type amorphous semiconductor layer 12i is formed, an impurity is not actively introduced. The thickness of the i-type amorphous semiconductor layer 12i is about several Å to 250 Å, for example.

The n-type amorphous semiconductor layer 12n is formed on the i-type amorphous semiconductor layer 12i. In the first embodiment, the n-type amorphous semiconductor layer 12n is formed to cover the i-type amorphous semiconductor layer 12i. The thickness of the n-type amorphous semiconductor layer 12n is about 10 nm, for example.

According to a structure (a so-called "BSF structure") in which the n-type amorphous semiconductor layer 12n is formed above the n-type crystalline silicon substrate 10n, it is possible to inhibit a recombination of minority carriers at the interface between the back surface of the n-type crystalline silicon substrate 10n and the amorphous semiconductor layer.

It is noted that according to a structure in which the thin i-type amorphous semiconductor layer 12i is interposed between the back surface of the n-type crystalline silicon substrate 10n and the n-type amorphous semiconductor layer 12n, it is possible to improve a characteristic between the back surface of the n-type crystalline silicon substrate 10n and the n-type amorphous semiconductor layer 12n.

In this case, it is possible to configure each of the i-type amorphous semiconductor layer 11i, the i-type amorphous semiconductor layer 12i, the p-type amorphous semiconductor layer 11p, and the n-type amorphous semiconductor layer 12n by an amorphous semiconductor containing silicon. Examples of the amorphous semiconductor include amorphous silicon, amorphous silicon carbide, and amorphous silicon germanium; however, the present invention is not limited thereto, and another amorphous semiconductor may be used. Each of the i-type amorphous semiconductor layer 11i, the i-type amorphous semiconductor layer 12i, the p-type amorphous semiconductor layer 11p, and the n-type amorphous semiconductor layer 12n may be configured by one element of the amorphous semiconductor, and may be configured by a combination of two or more elements of the amorphous semiconductor.

The p-side electrode 20p is a collecting electrode configured to collect a carrier. The p-side electrode 20p is formed above the p-type amorphous semiconductor layer 11p with the i-type amorphous semiconductor layer 12i and the n-type amorphous semiconductor layer 12n being interposed therebetween. Therefore, the p-side electrode 20p is formed in a line shape along the first direction.

As the p-side electrode 20p, metals such as Ag and Al, a conductive paste, etc., can be used.

The n-side electrode 20n is a collecting electrode configured to collect a carrier. The n-side electrode 20n is formed on the n-type amorphous semiconductor layer 12n. Therefore, the n-side electrode 20n is formed in a line shape along the first direction, between one p-side electrode 20p and another p-side electrode 20p.

It is noted that the p-side electrode 20p and the n-side electrode 20n may be a single-layered structure or a multiple-layered laminated structure. When the laminated structure is employed, a transparent conductive layer may be arranged on the n-type amorphous semiconductor layer 12n side. Examples of the transparent conductive layer include transparent conductive oxide such as indium oxide, tin oxide, and zinc oxide.

The p-side electrode 20p and the n-side electrode 20n may be formed to cover an approximate entire surface of the p-type amorphous semiconductor layer 11p or the n-type amorphous semiconductor layer 12n. With this formation, even when a sheet resistance of the p-type amorphous semiconductor layer 11p or the n-type amorphous semiconductor layer 12n is not too small, the carrier can be sufficiently collected by the p-side electrode 20p and the n-side electrode 20n.

The recombination layer R is arranged to inhibit the formation of a p(i)n junction by the p-type amorphous semiconductor layer 11p, the i-type amorphous semiconductor layer 12i, and the n-type amorphous semiconductor layer 12n, at the back surface side of an n(i)p junction formed by the n-type crystalline silicon substrate 10n, the i-type amorphous semiconductor layer 11i, and the p-type amorphous semiconductor layer 11p. Therefore, in this embodiment, it is attempted to achieve a low resistance between the p-side electrode 20p and the p-type amorphous semiconductor layer 11p by the interposing of the recombination layer R.

The recombination layer R having the above-described characteristic is formed by (1) a semiconductor material in which many in-gap levels exist in the energy band and (2) a metal material in an ohmic contact with the p-type amorphous semiconductor layer 11p.

(1) Semiconductor Material in which Many in-Gap Levels Exist in the Energy Band

When such a semiconductor material is used, if a carrier recombination by way of many in-gap levels existing in the energy band being is utilized, then it is possible to extract the carriers generated on the n-type crystalline silicon substrate 10n, with the p-type amorphous semiconductor layer 11p being interposed. Therefore, even when the recombination layer R is formed on the surface of the p-type amorphous semiconductor layer 11p, the contact of the both layers is achieved in a low resistance, i.e., approximates to an ohmic contact.

As described above, the thickness of the i-type amorphous semiconductor layer 12i formed on the surface of the recombination layer R is very thin, and thus, the effect as a barrier to a carrier is very small.

Thus, the low resistance between the p-side electrode 20p and the p-type amorphous semiconductor layer 11p is achieved, and this enables good extraction of carriers from the p-side electrode 20p.

In this case, examples of the semiconductor material configuring the recombination layer R include (i) a p-type semiconductor material containing more p-type impurities than the p-type amorphous semiconductor layer 11p, (ii) a semiconductor material containing many lattice defects, and (iii) an n-type semiconductor material containing more n-type impurities than the n-type amorphous semiconductor layer 12n. Examples of the semiconductor material containing many lattice defects include a semiconductor material (amorphous silicon carbide and amorphous silicon germanium) in which a lattice defect is increased by mixing a foreign element, such as carbon and germanium, with an amorphous silicon, and p-type or n-type microcrystalline silicon.

It is noted that when the conductivity type of the recombination layer R is of n-type, it is possible to form the recombination layer R by using the same material gas as that for the n-type amorphous semiconductor layer 12n, and therefore, it is possible to inhibit an increase in manufacture costs.

(2) Metal Material in an Ohmic Contact with the P-Type Amorphous Semiconductor Layer 11p When such a metal material is used, even if the recombination layer R is formed on the surface of the p-type amorphous semiconductor layer 11p, the contact of the both layers is achieved in a low resistance, i.e., approximates to an ohmic contact. Thus, the low resistance between the p-side electrode 20p and the p-type amorphous semiconductor layer 11p is achieved, and this enables good extraction of carriers from the p-side electrode 20p.

It is noted that as such a metal material, titan (Ti), tungsten (W), etc., may be used.

In order to inhibit an increase in a resistance component, the thickness of the recombination layer R preferably is 0.1 to 20 nm, and more preferably is 1 to 10 nm.

(Method of Manufacturing Solar Cell)

Next, the method of manufacturing the solar cell 100 will be described with reference to the cross-sectional surface of the solar cell 100.

Figure 3:
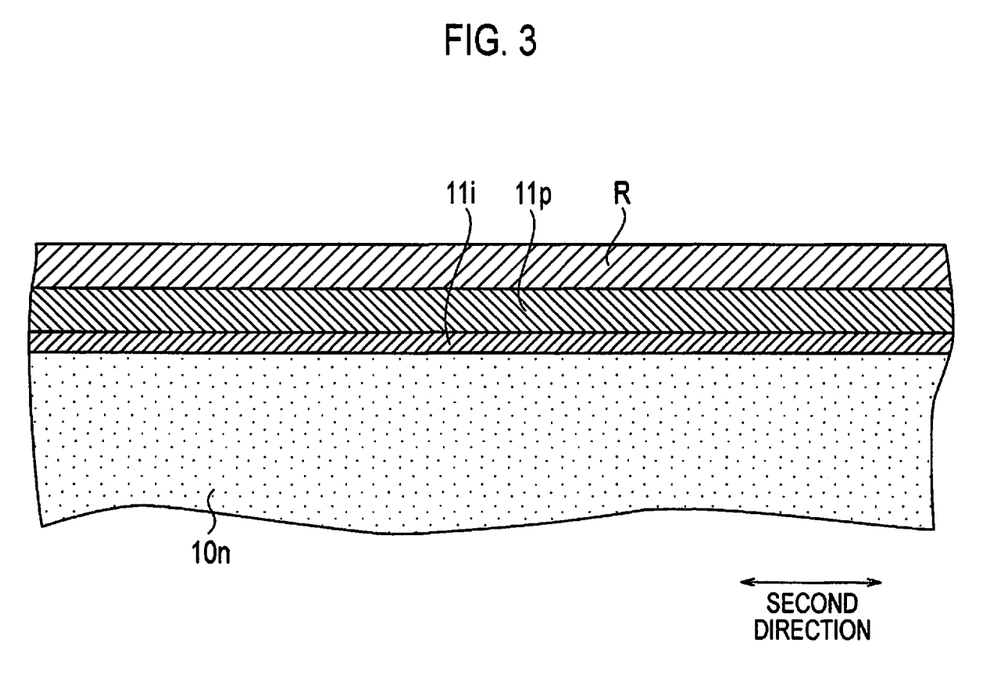
FIG. 3 is a diagram explaining a method of manufacturing the solar cell 10 according to the first embodiment of the present invention.

Firstly, as illustrated in FIG. 3, the recombination layer R is formed after the i-type amorphous semiconductor layer 11i and the p-type amorphous semiconductor layer 11p are sequentially formed on the entire back surface of the n-type crystalline silicon substrate 10n by using a CVD method. When the recombination layer R is formed by a semiconductor material, the CVD method, etc., may be used, and when the recombination layer R is formed by a metal material, a sputtering method and an evaporation method may be used.

Figure 4:
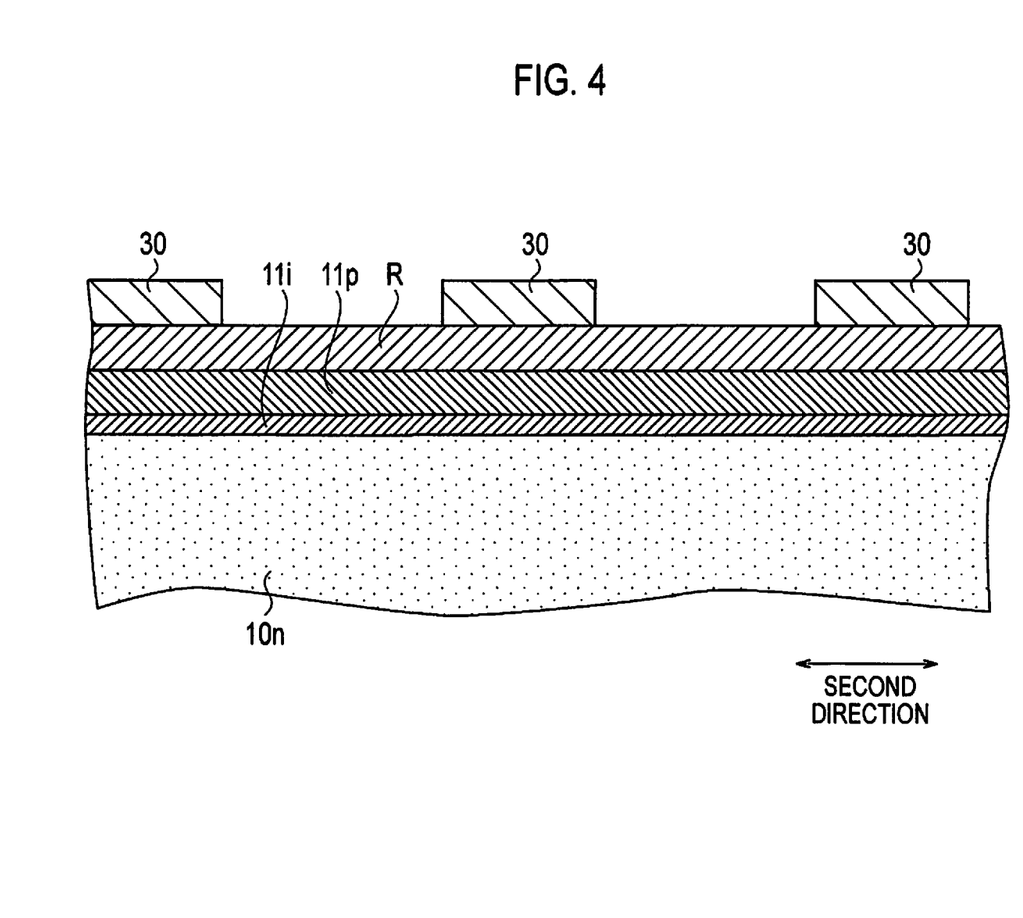
FIG. 4 is a diagram explaining the method of manufacturing the solar cell 10 according to the first embodiment of the present invention.

Subsequently, as illustrated in FIG. 4, on the recombination layer R, a resist film 30 is applied in a predetermined pattern. The predetermined pattern corresponds to a region in which the p-side electrode 20p is formed, and set along a dashed line in FIG. 1 as a reference, for example.

Figure 5:
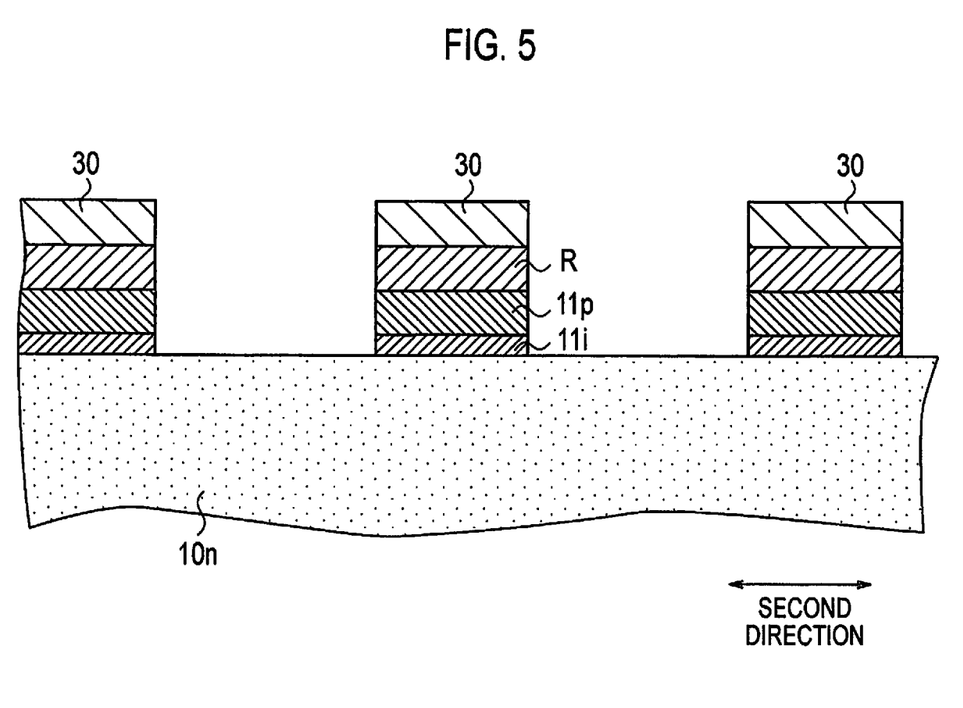
FIG. 5 is a diagram explaining the method of manufacturing the solar cell 10 according to the first embodiment of the present invention.

Subsequently, as illustrated in FIG. 5, an etching process is performed to pattern the i-type amorphous semiconductor layer 11i, the p-type amorphous semiconductor layer 11p, and the recombination layer R. At this time, when a material etched by an etching material of the amorphous semiconductor layer is used as a material of the recombination layer R, it is possible to perform an etching process on the recombination layer R simultaneously of the i-type amorphous semiconductor layer 11i and the p-type amorphous semiconductor layer 11p, and therefore, it is preferable in view of productivity improvement. Subsequently, after the removal of the resist film 30, an etching process and a hydrogen plasma process are performed to clean an exposed region of the back surface of the n-type crystalline silicon substrate 10n. It is noted that as a result of this, the etching process and the hydrogen plasma process may also be performed on the surface of the recombination layer R.

Figure 6:
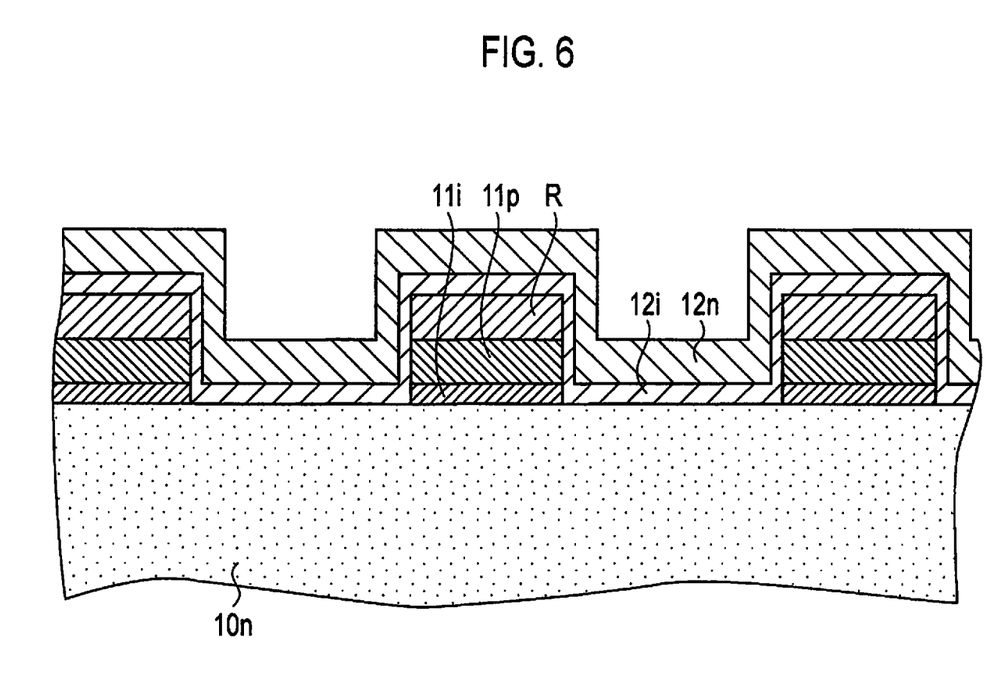
FIG. 6 is a diagram explaining the method of manufacturing the solar cell 10 according to the first embodiment of the present invention.

Subsequently, as illustrated in FIG. 6, a CVD method is used to sequentially form the i-type amorphous semiconductor layer 12i and the n-type amorphous semiconductor layer 12n to extend over the back surface of the n-type crystalline silicon substrate 10n and the recombination layer R.

Next, a CVD method, a sputtering method, an evaporation method, a plating method, a print method, etc., are used to form the p-side electrode 20p and the n-side electrode 20n in a predetermined pattern on the n-type amorphous semiconductor layer 12n.

(Operation and Effect)

The solar cell 100 according to the first embodiment includes the recombination layer R inserted between the p-type amorphous semiconductor layer 11p and the n-type amorphous semiconductor layer 12n. The p-type amorphous semiconductor layer 11p and the recombination layer R contact to each other in a low resistance.

This inhibits the electric field in an opposite direction of the electric field formed by the n-type crystalline silicon substrate 10n, the i-type amorphous semiconductor layer 11i, and the p-type amorphous semiconductor layer 11p from being formed by the p-type amorphous semiconductor layer 11p, the i-type amorphous semiconductor layer 12i, and the n-type amorphous semiconductor layer 12n. Therefore, the low resistance between the p-side electrode 20p and the p-type amorphous semiconductor layer 11p is achieved, and this enables good extraction of carriers from the p-side electrode 20p. As a result, it is possible to reduce a carrier collection loss, and therefore, it is possible to improve a characteristic of the solar cell 100.

The recombination layer R according to the first embodiment can be formed by the semiconductor material in which many in-gap levels exist in the energy band. In this case, when a carrier recombination by way of many in-gap levels in the energy band being is utilized, then it is possible to extract the carriers generated on the n-type crystalline silicon substrate 10n, with the p-type amorphous semiconductor layer 11p being interposed. Examples of the semiconductor material include a p-type semiconductor material containing more p-type impurities than the p-type amorphous semiconductor layer 11p, an n-type semiconductor material containing more n-type impurities than the n-type amorphous semiconductor layer 12n, and a microcrystalline silicon. In particular, when the conductivity type of the recombination layer R is the same as that of the amorphous semiconductor layer 12n, it is possible to form the recombination layer R by using the same material gas as that for the amorphous semiconductor layer 12n, and therefore, it is possible to inhibit an increase in manufacture costs.

The recombination layer R according to the first embodiment can be formed by a metal material in an ohmic contact with the p-type amorphous semiconductor layer 11p. Examples of the metal material include titan (Ti) and tungsten (W).

In the method of manufacturing the solar cell 100 according to the first embodiment, the i-type amorphous semiconductor layer 11i, the p-type amorphous semiconductor layer 11p, and the recombination layer R are patterned, and thereafter, the i-type amorphous semiconductor layer 12i and the n-type amorphous semiconductor layer 12n are sequentially formed to extend over the back surface of the n-type crystalline silicon substrate 10n and the recombination layer R.

In this way, the recombination layer R is formed on the p-type amorphous semiconductor layer 11p, and thus, it is not necessary to pattern the i-type amorphous semiconductor layer 12i and the n-type amorphous semiconductor layer 12n by using a mask, for example. As a result, it is possible to improve the productivity of the solar cell 100.

[Second Embodiment]

Hereinafter, a solar cell 100 according to a second embodiment will be described with reference to drawings. The description below is based primarily on the differences with respect to the first embodiment.

(Configuration of Solar Cell)

Figure 7:
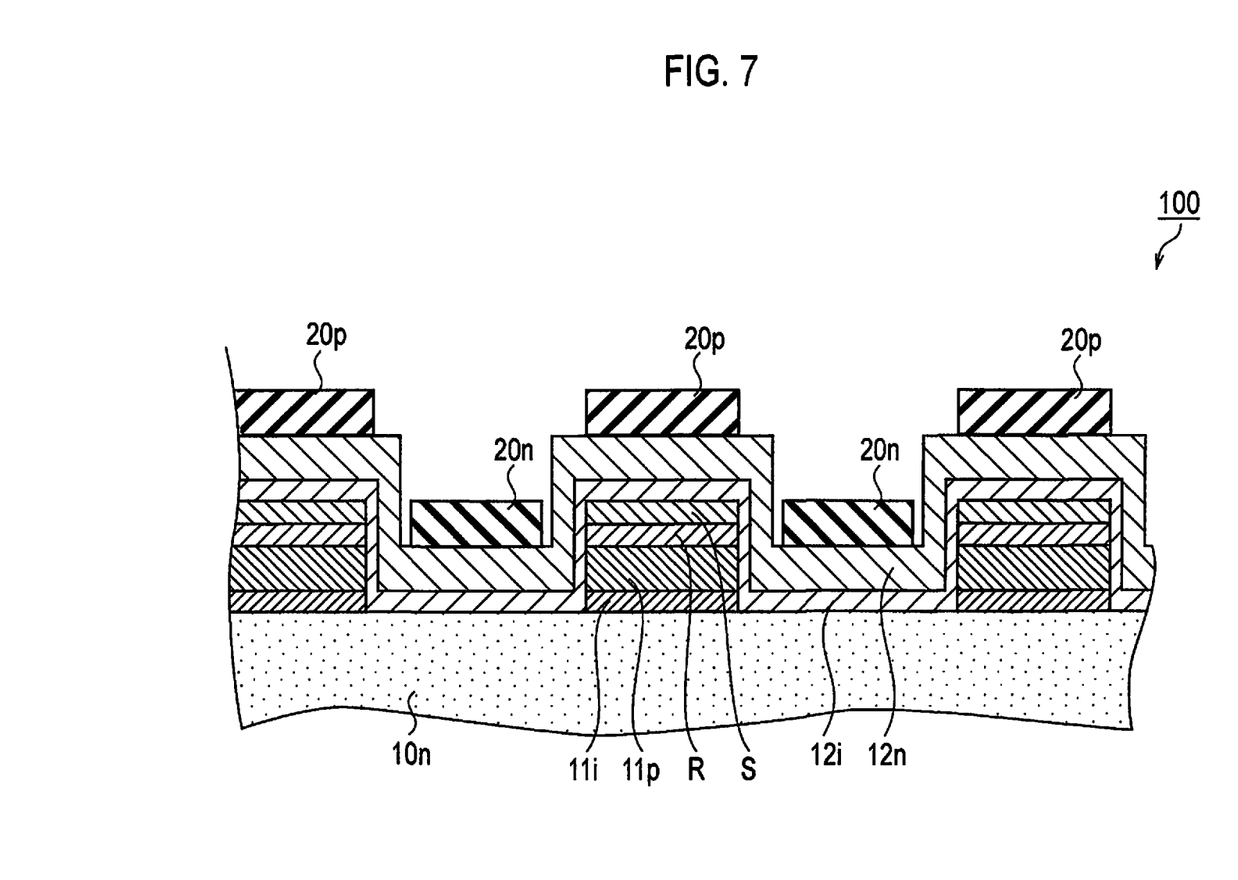
FIG. 7 is an enlarged cross-sectional view of a solar cell 100 according to a second embodiment.

FIG. 7 is an enlarged cross-sectional view of the solar cell 100 according to the second embodiment. As illustrated in FIG. 7, the solar cell 100 includes a semiconductor layer S.

The semiconductor layer S is interposed between the recombination layer R and the i-type amorphous semiconductor layer 12i. The semiconductor layer S has the same conductivity type as that of the n-type amorphous semiconductor layer 12n. Accordingly, at the back surface side of the n(i)p junction formed by the n-type crystalline silicon substrate 10n, the i-type amorphous semiconductor layer 11i, and the p-type amorphous semiconductor layer 11p, an n(i)n junction is formed by the semiconductor layer S, the i-type amorphous semiconductor layer 12i, and the n-type amorphous semiconductor layer 12n.

Thus, even when the n(i)n junction is formed at the back surface side of the n(i)p junction, since the thickness of the i-type amorphous semiconductor layer 12i is very thin, the effect as a barrier against a carrier is very small. Therefore, the carrier is extracted from the p-side electrode 20p with the n-type amorphous semiconductor layer 12n being interposed.

It is noted that when the conductivity type of the recombination layer R is the same as that of the amorphous semiconductor layer 12n, it is possible to form the recombination layer R, the semiconductor layer S, and the amorphous semiconductor layer 12n by using the same material gas, and therefore, it is possible to inhibit an increase in manufacture costs.

(Other Embodiments)

Although the present invention has been described with reference to the above embodiments, it should be understood that the present invention is not limited to the description and drawings which constitute a part of this disclosure. From this disclosure, various alternative embodiments, examples and operational technologies will become apparent to those skilled in the art.

For example, in the above embodiments, the n-type crystalline silicon substrate 10n is used as a substrate of the solar cell 100; however, the present invention is not limited thereto. For example, the substrate of the solar cell 100 may be imparted with a p-type conductivity. Moreover, the substrate of the solar cell 100 may be configured of a general semiconductor material including a crystalline semiconductor material such as polycrystalline Si and microcrystalline Si, or a compound semiconductor material such as GaAs and InP.

Moreover, in the above-described embodiments, the p-type amorphous semiconductor layer 11p is formed on the back surface of the n-type crystalline silicon substrate 10n after which the n-type amorphous semiconductor layer 12n is formed. However, the present invention is not limited thereto. For example, the order of forming the p-type amorphous semiconductor layer 11p and the n-type amorphous semiconductor layer 12n may be opposite. That is, the n-type amorphous semiconductor layer 12n may be formed on the back surface of the n-type crystalline silicon substrate 10n, and then, the p-type amorphous semiconductor layer 11p may be formed.

Although there is no particular description in the above-described embodiments, when a p-type substrate is used, the p-type amorphous semiconductor layer 11p and the n-type amorphous semiconductor layer 12n preferably are formed in an opposite manner to the formation of the above embodiments. That is, the p-type amorphous semiconductor layer 11p is formed to cover the i-type amorphous semiconductor layer 12i. In this case, generally, the p-type amorphous semiconductor tends to have a larger electric resistance than the n-type amorphous semiconductor, and thus, it is possible to further inhibit the generation of a leakage between the p-side electrode 20p and the n-side electrode 20n.

In the above-described embodiments, the i-type amorphous semiconductor layer 11i and the i-type amorphous semiconductor layer 12i are formed without actively introducing the impurities; however, only a very small amount of dopant may be included.

Although there is no particular description in the above-described embodiments, the i-type amorphous semiconductor layer 13i may not be formed on the back surface of the n-type crystalline silicon substrate 10n. In this case, it is possible to further reduce the resistance on the back surface side of the n-type crystalline silicon substrate 10n.

Moreover, in the embodiments, the p-type amorphous semiconductor layer 11p and the n-type amorphous semiconductor layer 12n are configured by an amorphous semiconductor; however, these layers 11p and 12n may be configured by an amorphous semiconductor carbide or a microcrystalline silicon.

In the embodiments, the recombination layer R has a one-layer structure; however, the present invention is not limited thereto. The recombination layer R may further include another layer capable of holding an ohmic contact with the p-type amorphous semiconductor layer 11p.

In the embodiments, the p-type amorphous semiconductor layer 11p has a one-layer structure; however, the present invention is not limited thereto. The p-type amorphous semiconductor layer 11p may further include another layer capable of holding an ohmic contact with the recombination layer R.

It is noted that the entire contents of Japanese Patent Application No. 2009-44431 (filed on Feb. 26, 2009) are hereby incorporated in the present specification by reference.

Industrial Applicability

Thus, the solar cell according to the present invention is useful in a solar cell manufacturing field because it is possible to provide a back junction solar cell by which it is possible to improve a solar cell characteristic.

EXPLANATION OF REFERENCE NUMERALS

10 SOLAR CELL
10n n-TYPE CRYSTALLINE SILICON SUBSTRATE
11i i-TYPE AMORPHOUS SEMICONDUCTOR LAYER
11p p-TYPE AMORPHOUS SEMICONDUCTOR LAYER
111P SUBSTRATE SIDE REGION
112P RECOMBINATION LAYER SIDE REGION
12i i-TYPE AMORPHOUS SEMICONDUCTOR LAYER
12n n-TYPE AMORPHOUS SEMICONDUCTOR LAYER
20n n-SIDE ELECTRODE
20p p-SIDE ELECTRODE
30 RESIST FILM
R RECOMBINATION LAYER
S SEMICONDUCTOR LAYER
100 SOLAR CELL

The invention claimed is:

1. A solar cell, comprising:
a semiconductor substrate;
a first semiconductor layer of first conductivity type formed on a first region on one main surface of the semiconductor substrate;
a second semiconductor layer of second conductivity type formed to cover the first region and to cover a second region on the one main surface of the semiconductor substrate;
a first electrode formed on the second semiconductor layer, on the first region; and
a second electrode formed on the second semiconductor layer, on the second region, wherein
on the first region, a recombination layer, which inhibits a formation of a p(i)n junction by the first semiconductor layer and the second semiconductor layer on the first region, is provided between the first semiconductor layer and the second semiconductor layer, with the recombination layer being interposed between the first electrode and the first semiconductor layer,
wherein the recombination layer is formed of an amorphous silicon mixed with a foreign element.

2. The solar cell according to claim 1, wherein
the recombination layer is formed of the same conductive type semiconductor as that of the second semiconductor layer.

3. The solar cell according to claim 2, wherein a dopant amount contained in the recombination layer is larger than a dopant amount contained in the second semiconductor layer.

4. The solar cell according to claim 1, wherein
the recombination layer is formed of the same semiconductor type semiconductor as that of the first semiconductor layer, and
a dopant amount contained in the recombination layer is larger than a dopant amount contained in the first semiconductor layer.

5. The solar cell according to claim 1, wherein the second conductivity type is of p-type.

6. The solar cell according to claim 1, comprising a third semiconductor layer of the second conductivity type inserted between the recombination layer and the second semiconductor layer.

7. The solar cell according to claim 1, comprising:
a first i-type semiconductor layer inserted between the semiconductor substrate and the first semiconductor layer; and
a second i-type semiconductor layer inserted between the semiconductor substrate and the second semiconductor layer.

8. The solar cell according to claim 1, wherein the foreign element is at least one of carbon and germanium.

9. A solar cell, comprising:
a semiconductor substrate;
a first semiconductor layer of first conductivity type formed on a first region on one main surface of the semiconductor substrate;
a second semiconductor layer of second conductivity type formed to cover the first region and to cover a second region on the one main surface of the semiconductor substrate;
a first electrode formed on the second semiconductor layer, on the first region; and
a second electrode formed on the second semiconductor layer, on the second region,
wherein on the first region, a recombination layer, which inhibits a formation of a p(i)n junction by the first semiconductor layer and the second semiconductor layer on the first region, is provided between the first semiconductor layer and the second semiconductor layer, with the recombination layer being interposed between the first electrode and the first semiconductor layer, and
wherein the recombination layer is formed of a p-type or an n-type microcrystalline silicon.

10. A solar cell comprising:
a semiconductor substrate;
a first semiconductor layer of first conductivity type formed on a first region on one main surface of the semiconductor substrate;
a second semiconductor layer of second conductivity type formed to cover the first region and to cover a second region on the one main surface of the semiconductor substrate;
a first electrode formed on the second semiconductor layer, on the first region: and
a second electrode formed on the second semiconductor layer, on the second region,
wherein on the first region, a recombination layer, which inhibits a formation of a p(i)n junction by the first semiconductor layer and the second semiconductor layer on the first region, is provided between the first semiconductor layer and the second semiconductor layer, with the recombination layer being interposed between the first electrode and the first semiconductor layer, and
wherein the recombination layer is formed of a metal in ohmic contact with the first semiconductor layer.

* * * * *